United States Patent [19]

Wolfe et al.

[11] Patent Number: 5,737,829

[45] Date of Patent: Apr. 14, 1998

[54] TERMINAL INSERTION MACHINE HAVING POSITION SENSING AND AUTOMATIC ACTUATION DEVICE

[75] Inventors: Bruce Allen Wolfe, Grantville; Wilmer Roy Sauder, Harrisburg, both of Pa.

[73] Assignee: The Whitaker Corporation, Wilmington, Del.

[21] Appl. No.: 764,373

[22] Filed: Dec. 13, 1996

[51] Int. Cl.$^6$ ............................... H05K 3/30; B23P 19/04
[52] U.S. Cl. ........................ 29/741; 29/593; 29/747; 29/838; 29/845
[58] Field of Search ........................ 29/593, 741, 747, 29/761, 837, 838, 845, 705, 715, 760; 382/145; 269/903

[56] References Cited

U.S. PATENT DOCUMENTS

| | | | |
|---|---|---|---|
| 4,378,632 | 4/1983 | Ammon et al. | 29/845 |
| 4,557,043 | 12/1985 | Starski | 29/741 |
| 4,590,660 | 5/1986 | Starski | 29/838 X |
| 4,627,157 | 12/1986 | Campini et al. | 29/741 |
| 4,649,633 | 3/1987 | Bocchicchio et al. | 29/838 X |
| 4,744,141 | 5/1988 | Musiani | 29/741 |
| 4,817,272 | 4/1989 | Campini et al. | 29/741 |
| 4,914,811 | 4/1990 | Nolte, Jr. | 29/747 |
| 5,165,165 | 11/1992 | Aoki et al. | 29/838 |

FOREIGN PATENT DOCUMENTS

| | | | |
|---|---|---|---|
| 216593 | 8/1994 | Japan | 29/838 |
| 808029 | 1/1959 | United Kingdom | 29/838 |

Primary Examiner—Peter Vo

[57] ABSTRACT

A terminal insertion machine (10) is disclosed that automatically actuates the insertion head (14) when the lower tooling (24) senses that the circuit board (26) is in proper alignment for receiving the tabs (166, 168) of the terminal (20). The lower tooling (24) includes a locating member (82) that senses the presents of two spaced holes (156, 158) in the circuit board (26) that are to receive tabs of the terminal and a rod (138) that senses the presence of the portion (162) of the circuit board (126) between the two holes (156, 158). A controller responds to a signal that the portion (162) of the circuit board is present and concurrently, that both holes (156, 158) are properly positioned. Upon receiving this signal the controller automatically actuates the insertion head (14) to insert the terminal 20 into the circuit board (26).

21 Claims, 6 Drawing Sheets

TERMINAL INSERTION MACHINE HAVING POSITION SENSING AND AUTOMATIC ACTUATION DEVICE

The present invention relates to machines for attaching an electrical terminal to a circuit board wherein the terminal has two tabs to be inserted into two holes in the circuit board, and more particularly to a device for sensing the proper position of the circuit board and automatically actuating the machine to insert the terminal.

BACKGROUND OF THE INVENTION

Low production and relatively inexpensive bench machines for attaching terminals to a circuit board are usually manually operated. Such machines include lower tooling that is attached to the base of the machine. Mating upper tooling is carried by an insertion head that, upon actuation, is moveable toward the lower tooling to insert the terminal and then is withdrawn preparatory to performing the next insertion. Usually a foot pedal or one or two hand operated trip mechanisms, such as electrical switches, are used to actuate the insertion head. The circuit board is manually aligned with the lower tooling and held in position while the foot or hand switches are actuated to cause the inserter head to insert a terminal into the holes in the circuit board. In cases where each of the terminals has two tabs that are inserted into two side by side holes in the circuit board, both holes must be accurately aligned with the tooling. Due to competitive pressures in the commercial environment, relatively unskilled labor is used to operate these machines while at the same time there is a strong incentive to maximize the rate of production. If the operator attempts to increase his rate of production beyond the capability of the machine or his skill level, errors in alignment may occur resulting in misaligned terminals or damaged circuit boards. This is especially true in the case of the terminals having two tabs where it is easy for an operator to align one of the holes with the lower tooling but not the other and then, believing that both holes are aligned, to actuate the insertion head. Such errors may be abetted by the use of a foot pedal to actuate the insertion head because of the convenience of the foot pedal and the desire to increase production output while, on the other hand, the use of two hand operated switches requires time for the operator to align the circuit board and then to move his hands to the hand switches and actuate them, thereby slowing production.

What is needed is a terminal insertion machine for inserting the two tabs of a terminal into side by side holes in a circuit board where the lower tooling of the machine includes a sensing mechanism for sensing when the two holes are properly aligned and then automatically actuating the insertion head to insert the terminal, with no other operator action required. This allows the operator to steady the circuit board with both hands during the insertion operation.

SUMMARY OF THE INVENTION

A machine is disclosed for attaching a component having two spaced apart tabs to a circuit board having two spaced apart holes, wherein each of the two tabs is inserted into a respective one of the two holes. The machine has a frame and an insertion head coupled to the frame. The insertion head is arranged to move the component along an insertion axis into inserted engagement with the circuit board. A circuit board positioning device is provided having a housing attached to the frame of the machine. The housing includes an abutting surface for engaging and positioning the circuit board along the insertion axis. A first electrical switch is coupled to the housing and has a first pair of contacts which are electrically interconnected when the first switch is closed and are electrically separated when the first switch is open. A resilient means is provided for urging the first switch closed. A second electrical switch is also coupled to the housing and has a second pair of contacts which are electrically interconnected when the second switch is closed and are electrically separated when the second switch is open. A resilient means is provided for urging the second switch closed. A lateral sensing means is arranged to open the first switch when the circuit board is out of proper lateral alignment with respect to the axis but will leave the first switch closed when the circuit board is in proper lateral alignment with respect to the axis. An axial sensing means is arranged to open the second switch when the circuit board is in abutting engagement with the abutting surface, Additionally, the insertion head is arranged to move the component into inserted engagement with the circuit board upon the opening of the first switch only when the second switch is closed.

DESCRIPTION OF THE PREFERRED EMBODIMENT

Figure 1:
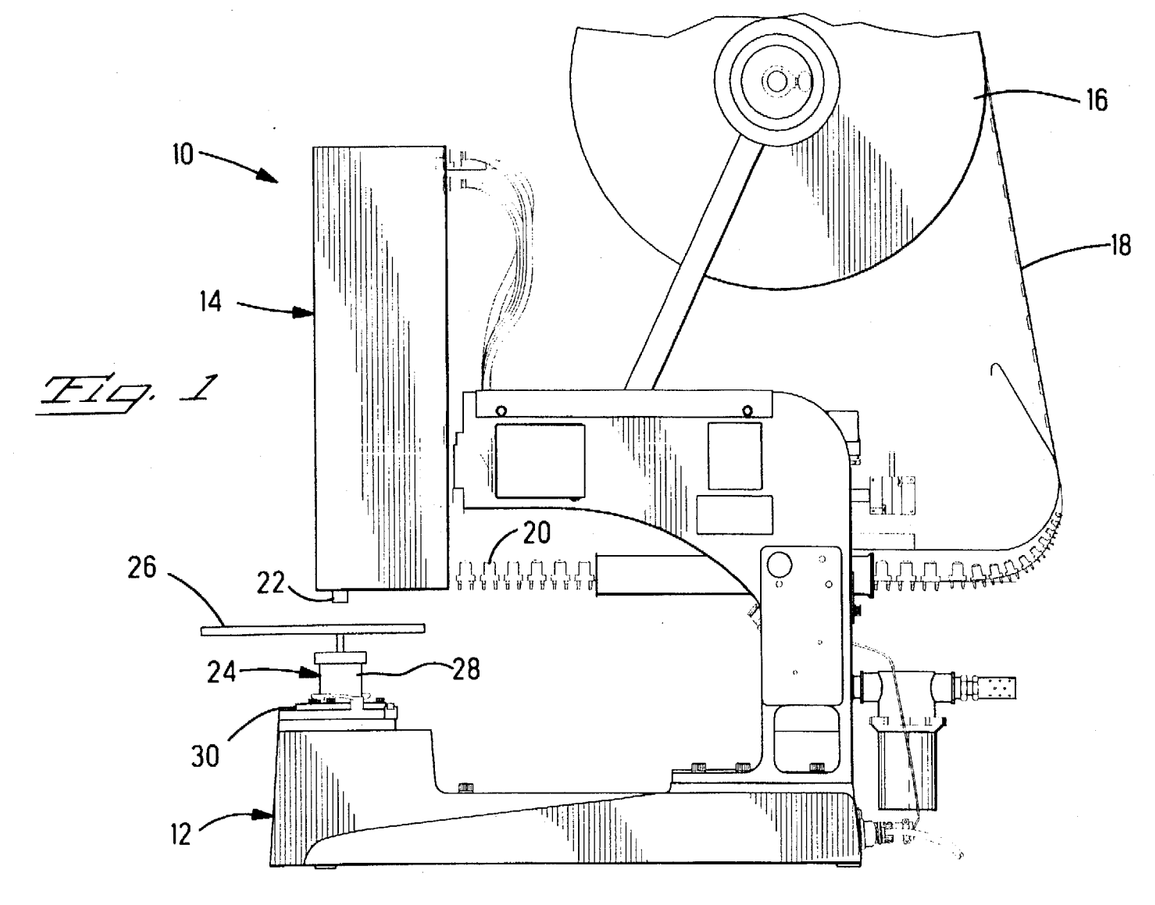
FIG. 1 is a side view of a terminal insertion machine incorporating the teachings of the present invention.
Figure 2:
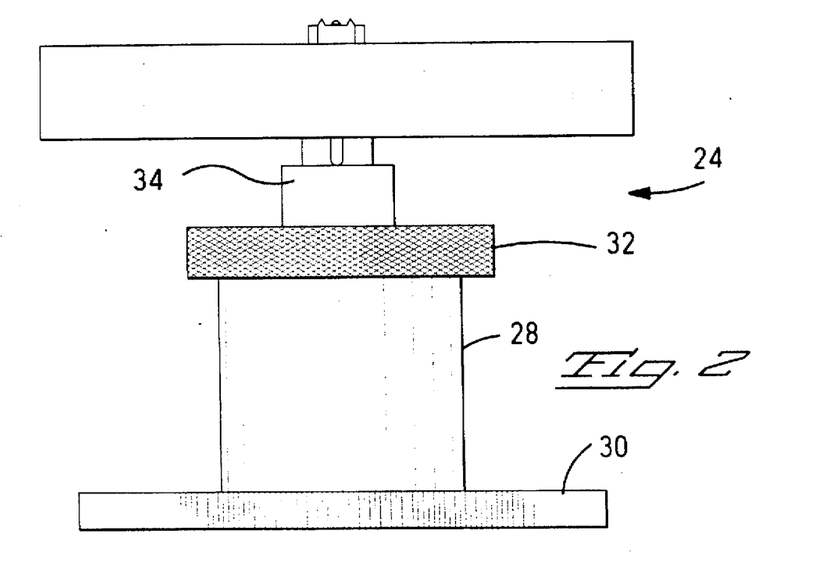
FIGS. 2 and 3 are front and top views, respectively, of the lower tooling shown in FIG. 1.
Figure 3:
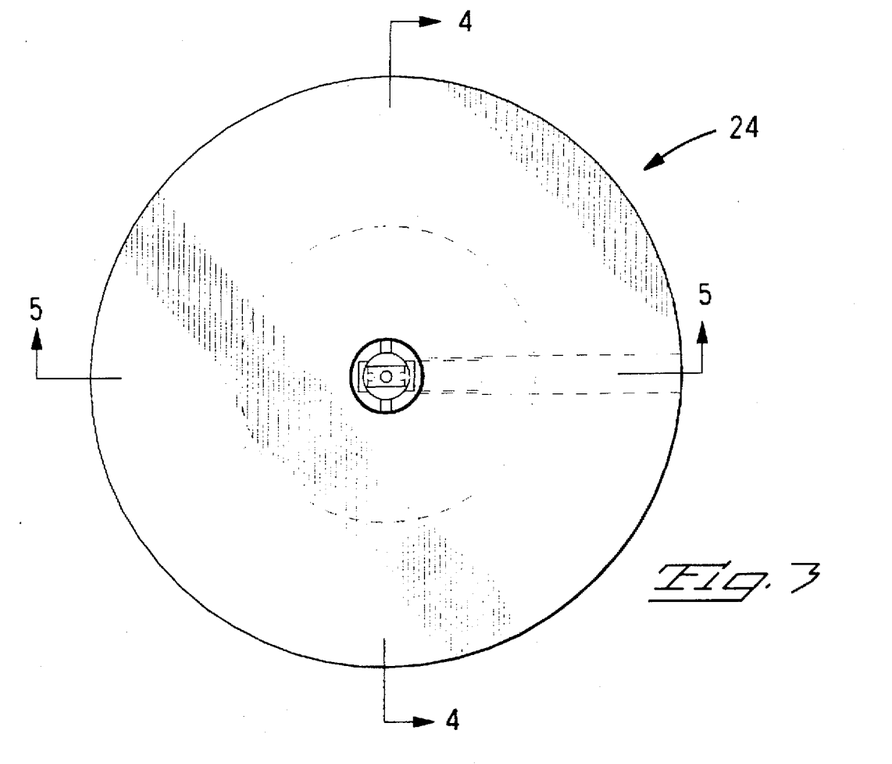

There is shown in FIG. 1 a component or terminal insertion machine 10 having a frame 12 and an insertion head 14 attached to the frame. A reel 16 is arranged to dispense a strip 18 of components or, in the present example, terminals 20 that are guided into the insertion head 14 and positioned, one at a time, in an inserter 22. Lower tooling 24 is attached to the frame 12 in alignment with the inserter 22 for supporting and accurately positioning a circuit board 26 so that holes in the circuit board are in proper alignment to receive the tabs or other portions of a terminal 20 to be inserted. The lower tooling 24, as shown in FIGS. 2 and 3, includes a tool holder 28 having a base 30 that is releasibly attached to the frame 12 of the machine, as shown in FIG. 1. The tool holder 28 has a knurled nut 32 that is threaded onto the outer diameter of the holder to position and secure a housing 34 of the lower tooling to the holder and the frame 12.

Figure 4:
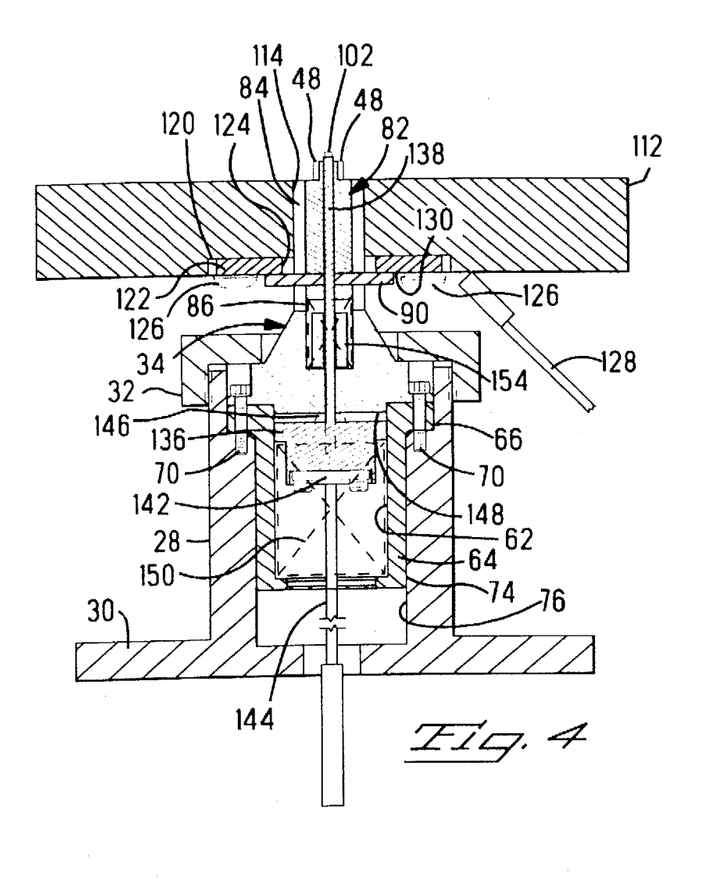
FIG. 4 is a cross-sectional view taken along the lines 4—4 in FIG. 3.
Figure 5:
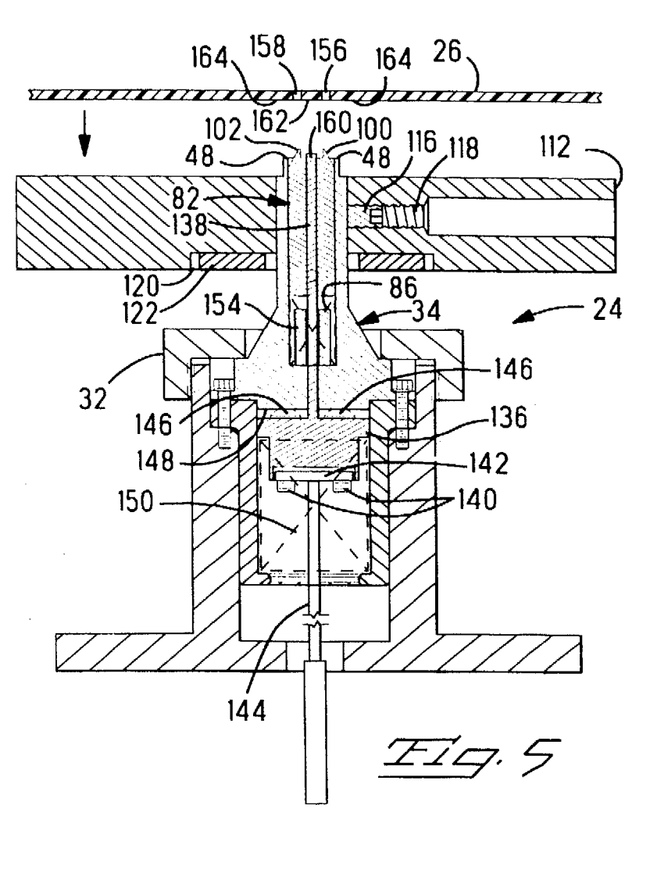
FIG. 5 is a cross-sectional view taken along the lines 5—5 in FIG. 3.
Figure 6:
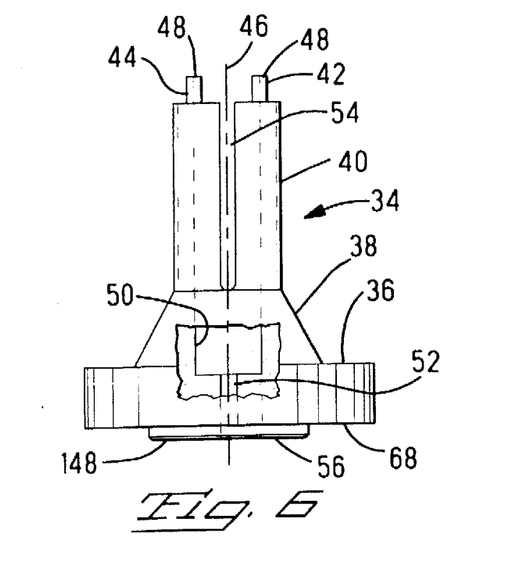
FIGS. 6 and 7 are front and top views of the tooling housing shown in FIG. 4.
Figure 7:
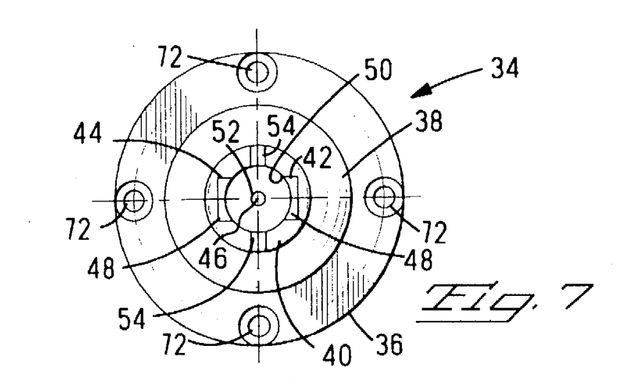

As shown in FIG. 4 through 7, the housing 34 has a base 36 and a conical shaped body 38 extending upwardly from the base. A threaded diameter portion 40 extends upwardly from the body 38, as best seen in FIGS. 6 and 7, and terminates in two rectangular shaped projections 42 and 44 that are on opposite sides of a centerline 46 of the cylindrically shaped portion 40. The upper surfaces of the two projections are abutting surfaces 48 for receiving a surface of a circuit board, as will be explained below. A blind bore 50 is formed through the threaded diameter portion 40, the conical body 38, and into the base 36 a short distance, as best seen in FIG. 6. A smaller hole 52 extends from the bottom of the bore 50 through the remainder of the base 36, as shown. A slot 54 is formed through the portion 40 for its entire length and is arranged at an angle of about 90 degrees to the two projections 42 and 44, as best seen in FIG. 7. A short hub 56 extends from the base 36 in a direction opposite that of the conical body 38 and locates in an inner diameter 62 of a sleeve 64, as best seen in FIG. 4. The sleeve 64 has a flange 66 that abuts against the lower surface 68 of the base 36. The housing 34 is secured to the sleeve 64 by means of four screws 70 which extend through clearance holes 72 in the base 36 and into threaded holes in the flange 66. An outer diameter 74 of the sleeve 64 is a loose slip fit with an inner diameter 76 of the tool holder 28.

Figures 8, 9, 10:
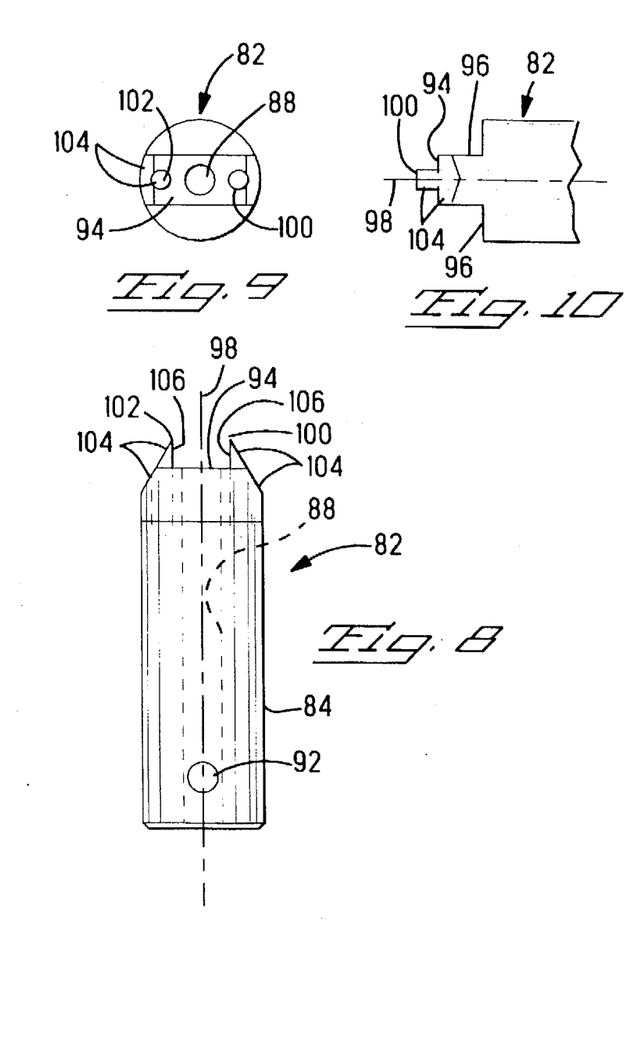
FIGS. 8 and 9 are front and top views of the guide member shown in FIG. 4.
FIG. 10 is a partial side view of the guide member shown in FIG. 9.

A locating member 82 has a cylindrically shaped body 84 that is a loose slip fit with the bore 50 so that the body is free to slide vertically within the bore, as viewed in FIG. 4 and 5. A spring 86 is disposed in the bottom of the bore 50 and is arranged to urge the locating member 82 upwardly within the bore. As best seen in FIGS. 8, 9, and 10, the locating member 82 includes an axially formed hole 88 that is substantially the same size as the hole 52 in the base 36 and runs completely through the locating member. A pin 90, as shown in FIG. 4, is pressed into and extends through a hole 92 that is formed diametrically through the body 84 at right angles thereto, as shown in FIG. 8, for a purpose that will be explained. The upwardly facing end 94 of the locating member 82, as best seen in FIGS. 8 and 10, includes two cutouts 96 formed on opposite sides of the centerline 98. A pair of locating tips 100 and 102 are formed by pressing two pins into holes in the end 94 on opposite sides of the centerline 98. Each pin is beveled to form angled surfaces 104 while the two opposed surfaces 106 of the two pins are parallel to the centerline 96. The bevels continue the angled surfaced 104 along portions of the body 84 near its end 94, as shown in FIGS. 8, 9, and 10. When the locating member 82 is in position within the bore 50, the pin 90 extends through the slot 54 on each side of the threaded diameter portion 40, as show in FIG. 4.

An electrically insulating disk 112 or first dielectric body, includes a central threaded bore 114 therethrough that is in threaded engagement with the threaded diameter portion 40 and is secured thereto by means of a set screw 116 that is threaded into a hole 118 formed in the disk, as best seen in FIG. 5. The disk 112 includes a counterbore 120 or recess in its lower side for receiving an electrically conductive washer 122 which, in the present example, is made of brass. The brass washer 122 has an inside diameter 124 that is sufficiently large to not contact the housing 34. The brass washer is secured to the disk 112 by means of screws 126 that extend through clearance holes in the washer and into threaded holes in the disk. A wire lead 128 is electrically connected to the brass washer by means of one of the screws 126, for a purpose that will be explained. The spring 86 urges the locating member 82 upwardly within the bore 50, as best seen in FIG. 4, until the pin 90 engages an under surface 130 of the brass washer 122, wherein the pin 90 and the surface 130 define a first electrical switch that electrically interconnect the wire lead 128 to the frame 12 of the machine 10. The first electrical switch is closed when the pin 90, a first electrical contact, is in electrical engagement with the surface 130, a second electrical contact, and is open when the pin 90 is spaced from the surface 130.

Another electrically insulating disk 136, or second dielectric body, is arranged to freely move vertically within the inner diameter 62 of the sleeve 64, as show in FIGS. 4 and 5. A rod 138 is pressed into a hole in the disk 136 and extends upwardly from its center through the hole 52 of the housing 34 and the hole 88 of the locating member 82 and is sized to be a loose slip fit with the holes 52 and 88. Two screws 140 extend through clearance holes in the disk 136 and into threaded holes in a metal washer 142. Another wire lead 144 has its end soldered to the underside of the washer 142. The heads 146 of the screws 140 are arranged on the upper surface of the insulating disk 136 so that they can engage an under surface 148 of the housing 34 thereby defining a second electrical switch that electrically interconnecting the wire lead 144 to the frame 12 of the machine 10. The second electrical switch is closed when a head 146, a third electrical contact, is in electrical engagement with the surface 148, a fourth electrical contact, and is open when both heads 146 are spaced from the surface 148. A spring 150 is arranged within the inner diameter 62 of the sleeve 64 to urge the disk 136 upwardly so that the screw heads 146 are in electrical engagement with the surface 148. The machine 10 includes a controller, not shown, interconnected to the two wire leads 128 and 144 that actuates the insertion head 14 to insert a terminal when both the wire lead 128 is electrically interconnected to the frame 12 and the wire lead 144 is electrically isolated from the frame. Such a controller is well know in the art and, therefore, will not be described here.

Optionally, a crimping spacer 154 having a clearance hold for the rod 138 is disposed loosely within the inner diameter of the spring 86, as shown in FIGS. 4 and 5. The crimping spacer 154 has a length that is chosen to limit downward movement of the locating member 82, for a purpose that will be explained below.

Figure 11:
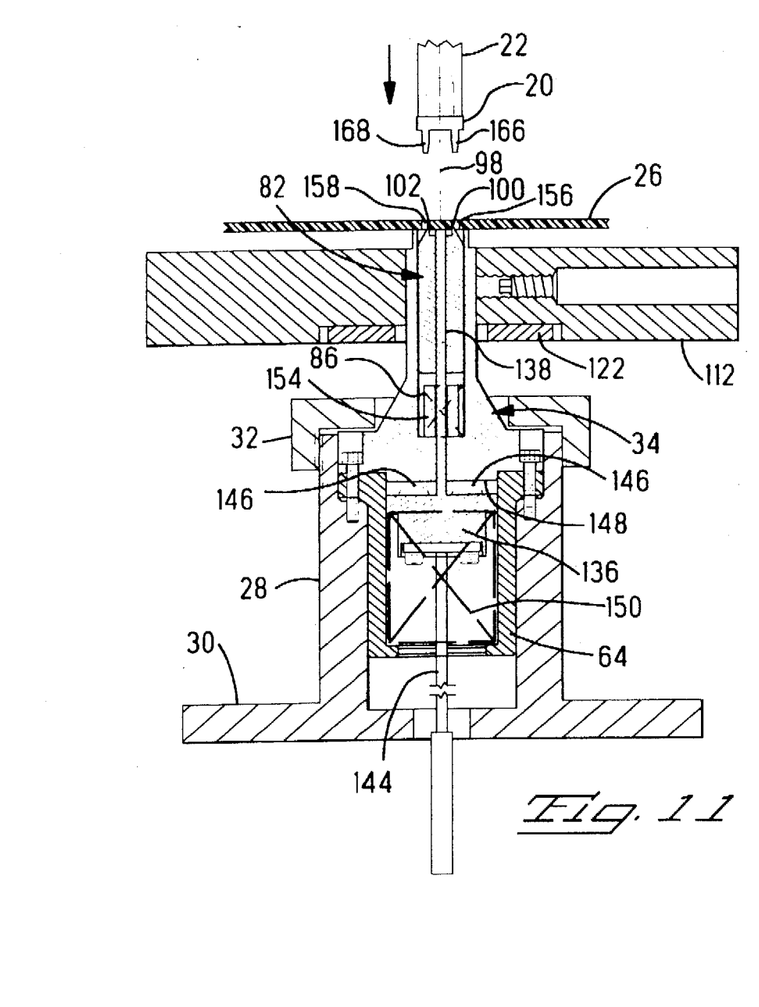
FIGS. 11 and 12 are views similar to that of FIG. 5 showing different steps of the insertion operation.
Figure 12:
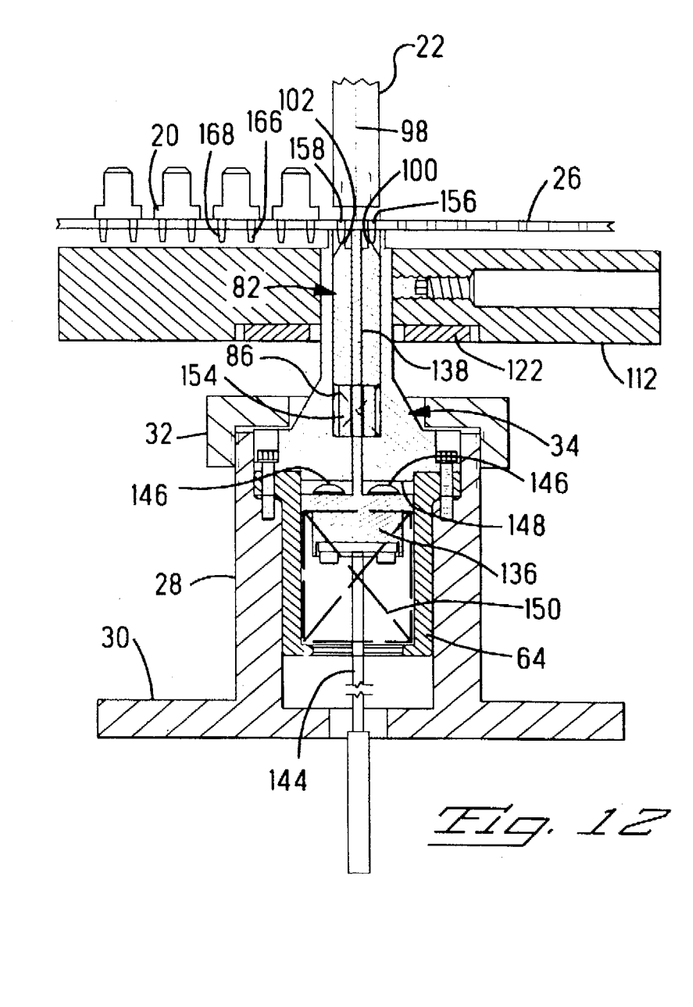
Figure 13:
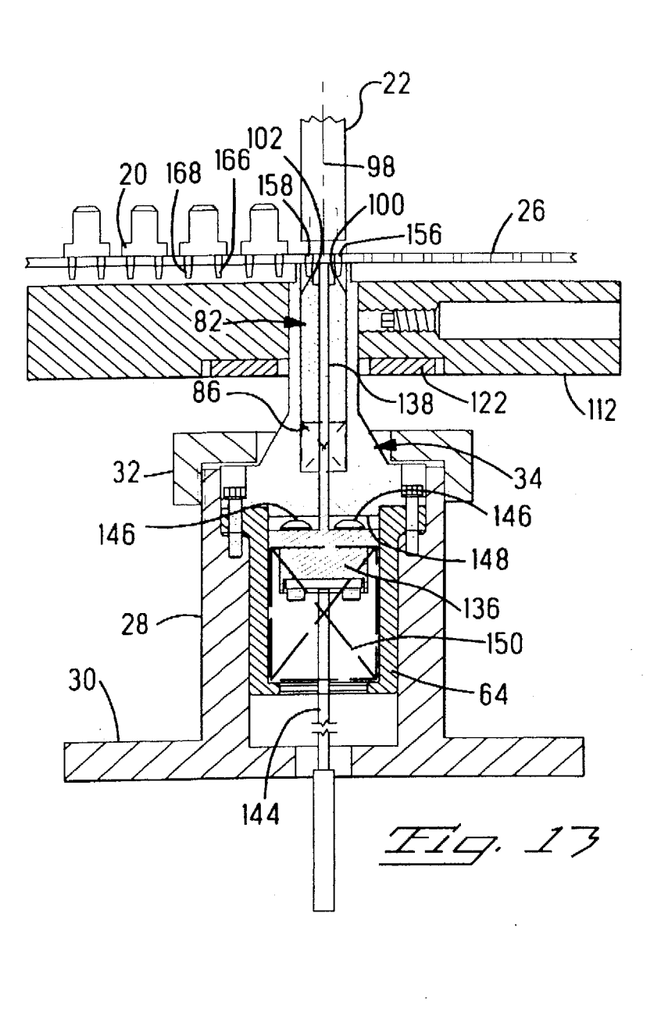
FIG. 13 is a view similar to FIG. 12 showing the insertion operation with the crimp spacer removed.

The operation of the machine 10 will now be described with reference to FIGS. 5, 11, 12, and 13. The circuit board 26 is positioned over the lower tooling 24, as shown in FIG. 5, with the two holes 154 and 156 in vertical alignment with the two locating tips 101 and 102, respectively. The circuit board 26 is lowered onto the lower tooling 24 so that the tips 100 and 102 inter into the holes 156 and 158, respectively, and the portion 162 of the circuit board between the two holes engages the end 160 of the road 138. As downward motion continues the lower surface 164 of the circuit board engages the abutting surfaces 48 of the housing 34 while concurrently the rod 138 moves the insulating disk 136 downwardly against the urging of the spring 150 so that the screw heads 146 break contact with the lower. surface 148 of the housing 34. Immediately the controller receives a signal of the wire lead 144 being disconnected from the frame as the screw heads break contact while the other wire lead 128 remains interconnected to the frame 12 by means of the pin 90 and surface 130. Due to the signal indicating that the wire lead 144 has disconnected and the wire lead 128 has remained connected, the controller actuates the insertion head 14 so that the inserter 22, having a terminal 20 in position, moves downwardly toward the circuit board along an insertion axis that is coaxial with the centerline 98, as shown in FIG. 11, and completes the insertion of the terminal, as shown in FIG. 12. Note that the terminal 20 includes two spaced apart tabs 166 and 168 that enter the two holes 156 and 158, respectively. As the two tabs enter the holes the tabs engage the angled surfaces 104 and push the locating member 82 downwardly within the bore 50 until it bottoms out against the crimp spacer 154 and stops. While this movement causes the pin 90 to break contact with the surface 130 of the brass washer 122, the downward momentum of the inserter mechanism is sufficient to continue carrying the inserter and terminal 20 downward so that the two tabs 166 and 168 are spread apart by the angled surfaces 104, thereby completing the insertion and crimping of the terminal. This process can be repeated any desired number of times and, as shown in FIG. 12, the terminals 20 can be inserted relatively close together, due to the structure and positioning of the projections 42 and 44. If it is desired to insert tabs 166 and 168 of the terminals 20 into the holes 156 and 158 without crimping, the crimping spacer 154 is simply removed and the above described procedure performed. In this case, the tabs 166 and 168 engage and push the locating member 82 downwardly until the inserted 22 reaches the end of its stroke, as shown in FIG. 13. This method of insertion is used when there is an interference fit between the tabs 166 and 168 and the holes 156 and 158, and crimping is not needed or desired.

Figure 14:
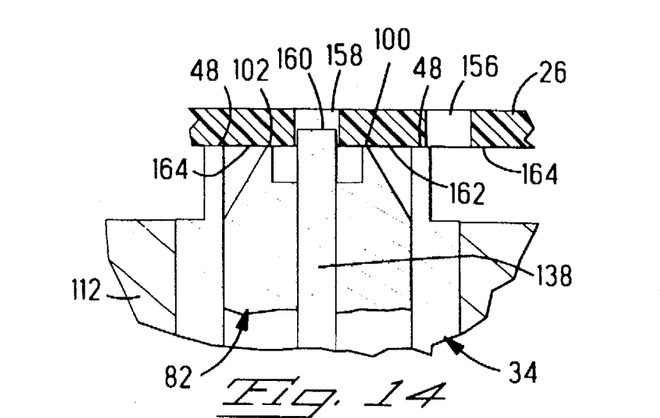
FIGS. 14 and 15 are partial views of the mechanism shown in FIG. 11 showing the affects of a misaligned circuit board.
Figure 15:
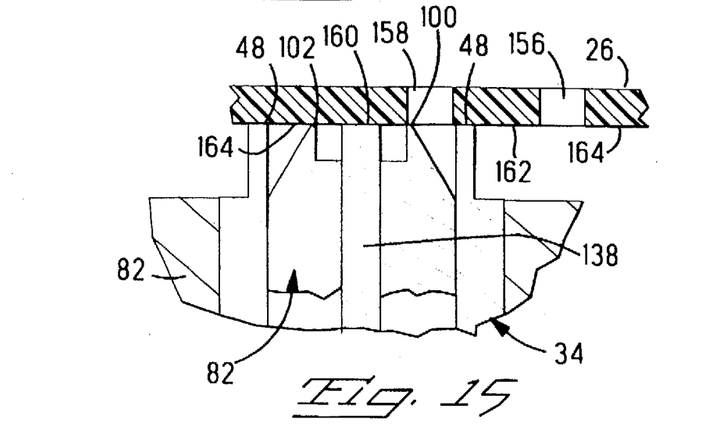

In the event that the circuit board 26 is misaligned with the lower tooling 24 so that the hole 158 is in alignment with the end 160 of the rod 138, as shown in FIG. 14, the rod 138 will extend into the hole 158 so that the wire lead 144 remains interconnected to the frame 12 while the tips 100 and 102 engage the underside of the circuit board and are pushed downwardly so that the pin 90 breaks contact with the surface 130 and the wire lead 128 is no longer electrically interconnected with the frame 12. The controller does not recognize with this as a signal to actuate the insertion head. Similarly, if the circuit board 26 is misaligned as shown in FIG. 15, where the under surface of the circuit board engages the end 160 and one of the tips 100 or 102 and pushes both the rod 138 and the locating member 82 downwardly, both wire leads 128 and 144 will be electrically disconnected from the frame 12, and the controller will not recognize this as a signal to actuate the insertion head. As stated above, the controller will actuate the insertion head only upon receiving the signal that the wire lead 144 breaks electrical contact with the frame 12 while concurrently the wire lead 128 remains in electrical contact with the frame.

An important advantage of the present invention is that the terminal insertion head cannot be actuated unless the circuit board is properly aligned with the lower tooling, thereby reducing the number of damaged circuit boards and misaligned terminals. Additionally, the operator is free to use both hands to steady the circuit board during the insertion operation. Further, once the circuit board is in proper alignment the insertion head is immediately and automatically actuated thereby minimizing the amount of time required to complete the operation.

We claim:

1. In a machine for inserting portions of a component into holes in a circuit board, said machine having a frame and an insertion head coupled to said frame, said insertion head arranged to move said component along an insertion axis into inserted engagement with said circuit board, a circuit board positioning device comprising:

(a) a housing attached to said frame, said housing having an abutting surface for engaging and positioning said circuit board along said insertion axis;

(b) first and second electrical switches coupled to said housing each of which has open and closed states;

(c) lateral sensing means for opening said first switch when said circuit board is out of proper lateral alignment with respect to said insertion axis and for leaving said first switch closed when said circuit board is in proper lateral alignment with respect to said insertion axis; and (d) axial sensing means for opening said second switch only when said circuit board is in said engagement with said abutting surface, wherein said insertion head effects said movement of said component into said inserted engagement with said circuit board upon said opening of said second switch only when said first switch is closed.

2. The machine according to claim 1 wherein said component has two spaced apart tabs and said circuit board has two spaced apart holes arranged so that each of said two tabs is inserted into a respective one of said two holes, wherein said lateral sensing means comprises two spaced projections on opposite sides of said insertion axis, coupled to said first switch, and extending from said abutting surface in a direction toward said insertion head into a first position, said two projections arranged to extend into said two spaced holes in said circuit board only when said circuit board is in said proper lateral alignment, and to retract substantially to a second position flush with said abutting surface and open said first switch when said circuit board is in engagement with said abutting surface but not in said proper lateral alignment.

3. The machine according to claim 2 wherein said lateral sensing means includes a member having said two projections attached to an end thereof, said member being in sliding engagement with said housing and arranged to slide along said insertion axis thereby carrying said projections between said first and second positions, including resilient means urging said two projections into said first position.

4. The machine according to claim 3 wherein said first switch comprises:

a first dielectric body attached to said housing;

a first electrical contact attached to said first dielectric body;

a second electrical contact attached to said member so that said first and second electrical contacts are in electrical engagement when said projections are in said first position and are not in electrical engagement when said projections are in said second position.

5. The machine according to claim 4 wherein said second electrical contact is a pin extending from a side of said member through an opening in said housing.

6. The machine according to claim 5 wherein said member is in sliding engagement with a first opening in said housing and said resilient means is a spring in said first opening.

7. The machine according to claim 6 wherein each of said projections has a beveled surface facing away from said insertion axis for engaging said portions of said component during insertion thereof, said portions moving said member further into said first opening past said second position of said projections.

8. The machine according to claim 7 including a crimping spacer in said first opening of said housing for limiting said further movement of said member into said first opening so that during said insertion said portions are crimped and said component is secured to said circuit board.

9. The machine according to claim 2 wherein said axial sensing means includes a rod in sliding engagement with a second opening in said member and extending between said two projections and an end of said rod extending above said abutting surface toward said insertion heading said rod coupled to said second switch so that when said rod end is retracted substantially flush with said abutting surface said second switch is opened.

10. The machine according to claim 9 wherein said second opening is coaxial with said insertion axis.

11. The machine according to claim 10 wherein said second switch comprises a second dielectric body arranged to slide toward and away from said housing, a third electrical contact attached to said second dielectric body, and a fourth electrical contact attached to said housing so that said third and fourth contacts are in electrical engagement when said rod end extends above said abutting surface and are not in electrical engagement when said rod end is substantially flush with said abutting surface.

12. The machine according to claim 11 wherein said fourth electrical contact is a surface of said housing.

13. In a machine for attaching a component having two spaced apart tabs to a circuit board having two spaced apart holes, wherein each of said two tabs is inserted into a respective one of said two holes, said machine having a frame and an insertion head coupled to said frame, said insertion head arranged to move said component along an insertion axis into inserted engagement with said circuit board, a circuit board positioning device comprising:

(a) a housing attached to said frame, said housing having an abutting surface for engaging and positioning said circuit board along said insertion axis;

(b) a first electrical switch coupled to said housing and having a first pair of contacts which are electrically interconnected when said first switch is closed and are electrically separated when said first switch is open, including resilient means for urging said first switch closed;

(c) a second electrical switch coupled to said housing and having a second pair of contacts which are electrically interconnected when said second switch is closed and are electrically separated when said second switch is open, including resilient means for urging said second switch closed;

(d) lateral sensing means for opening said first switch when said circuit board is out of proper lateral alignment with respect to said axis and for leaving said first switch closed when said circuit board is in proper lateral alignment with respect to said axis; and (e) axial sensing means for opening said second switch only when said circuit board is in said abutting engagement with said abutting surface, wherein said insertion head effects said moving of said component into said inserted engagement with said circuit board upon said opening of said second switch only when said first switch is closed.

14. In a machine for inserting two tabs of a terminal into two spaced apart holes in a circuit board, said machine having a frame and an insertion head coupled to said frame moving said terminal into inserted engagement with said circuit board, a circuit board positioning device comprising:

(a) a housing attached to said frame, said housing having an abutting surface for engaging and positioning said circuit board along said insertion axis;

(b) first and second electrical switches coupled to said housing each of which has open and closed states;

(c) lateral sensing member having two spaced projections on opposite sides of said insertion axis arranged to enter said two spaced holes of said circuit board leaving said first switch open when said circuit board is in proper lateral position with respect to said insertion axis;

(d) axial sensing means for opening said second switch when sensing a portion of said circuit board between said two holes, wherein said insertion head effects said movement of said terminal into said inserted engagement with said circuit board upon said opening of said second switch only when said first switch is closed.

15. The machine according to claim 14 wherein said lateral sensing member is in sliding engagement with said housing and arranged to slide along said insertion axis thereby carrying said projections between first and second positions, including resilient means urging said two projections into said first position.

16. The machine according to claim 15 wherein said first switch comprises:

a first dielectric body attached to said housing;

a first electrical contact attached to said first dielectric body;

a second electrical contact attached to said member so that said first and second electrical contacts are in electrical engagement when said projections are in said first position and are not in electrical engagement when said projections are in said second position.

17. The machine according to claim 16 wherein said second electrical contact is a pin extending from a side of said lateral sensing member through an opening in said housing.

18. The machine according to claim 17 wherein said lateral sensing member is in sliding engagement with a first opening in said housing and said resilient means is a spring in said first opening.

19. The machine according to claim 18 wherein each of said projections has a beveled surface facing away from said insertion axis for engaging said tabs of said terminal during insertion thereof, said tabs moving said lateral sensing member further into said first opening past said second position of said projections.

20. The machine according to claim 19 including a crimping spacer in said first opening of said housing for limiting said further movement of said member into said first opening so that during said insertion said tabs are crimped and said terminal is secured to said circuit board.

21. The machine according to claim 20 wherein said axial sensing means includes a rod in sliding engagement with a second opening in said lateral sensing member and extending between said two projections and an end of said rod extending above said abutting surface toward said insertion head, said rod coupled to said second switch so that when said rod end is retracted substantially flush with said abutting surface said second switch is opened.

* * * * *